US009829552B2

(12) United States Patent
Albsmeier et al.

(10) Patent No.: US 9,829,552 B2
(45) Date of Patent: Nov. 28, 2017

(54) TRANSMISSION ARRANGEMENT FOR A TOMOGRAPH

(71) Applicants: Andre Albsmeier, München (DE); Sebastian Martius, Forchheim (DE); Markus Vester, Nürnberg (DE)

(72) Inventors: Andre Albsmeier, München (DE); Sebastian Martius, Forchheim (DE); Markus Vester, Nürnberg (DE)

(73) Assignee: Siemens Aktiegesellschaft, Münich (DE)

( * ) Notice: Subject to any disclaimer, the term of this patent is extended or adjusted under 35 U.S.C. 154(b) by 764 days.

(21) Appl. No.: 14/243,402

(22) Filed: Apr. 2, 2014

(65) Prior Publication Data

US 2014/0300361 A1 Oct. 9, 2014

(30) Foreign Application Priority Data

Apr. 3, 2013 (DE) ........................ 10 2013 205 817

(51) Int. Cl.
*G01R 33/36* (2006.01)
*G01R 33/34* (2006.01)
(Continued)

(52) U.S. Cl.
CPC ... *G01R 33/3692* (2013.01); *G01R 33/34046* (2013.01); *G01R 33/34092* (2013.01);
(Continued)

(58) Field of Classification Search
CPC ........ G01R 33/34046; G01R 33/34092; G01R 33/288; G01R 33/481; G01R 33/34076; G01R 33/3692
See application file for complete search history.

(56) References Cited

U.S. PATENT DOCUMENTS 6,211,677 B1    4/2001  Burl et al.
6,437,567 B1 *  8/2002  Schenck .......... G01R 33/34061
                                                        324/318
(Continued)

FOREIGN PATENT DOCUMENTS

CN      1393699 A    1/2003
CN      1868406 A    11/2006
(Continued)

OTHER PUBLICATIONS

Arnulf Oppelt, "Imaging Systems for Medical Diagnostics", Publicis Corporate Publishing, 2005, ISBN 3-89578-226-2 [table of contents].
(Continued)

*Primary Examiner* — Gregory H Curran
(74) *Attorney, Agent, or Firm* — Lempia Summerfield Katz LLC

(57) ABSTRACT

A transmission arrangement for a tomograph, such as magnetic resonance tomography, is provided for wireless energy supply of a local coil system. The transmission arrangement includes at least one first region having at least one first antenna element. The transmission arrangement further includes at least one second region having at least one second antenna element. The at least one first region and the at least one second region are connected to one another via at least one rejector circuit.

19 Claims, 1 Drawing Sheet

(51) Int. Cl.
  *G01R 33/28* (2006.01)
  *G01R 33/48* (2006.01)
(52) U.S. Cl.
  CPC ...... *G01R 33/288* (2013.01); *G01R 33/34076* (2013.01); *G01R 33/481* (2013.01)

(56) References Cited

U.S. PATENT DOCUMENTS

| | | |
|---|---|---|
| 2003/0001574 A1 | 1/2003 | Kroeckel et al. |
| 2006/0293580 A1 | 12/2006 | Ladebeck et al. |
| 2008/0106264 A1 | 5/2008 | Fischer et al. |
| 2012/0313645 A1 | 12/2012 | Biber et al. |

FOREIGN PATENT DOCUMENTS

| | | |
|---|---|---|
| DE | 69925193 | 2/2006 |
| DE | 102006052217 | 5/2008 |
| DE | 102011076918 | 12/2012 |

OTHER PUBLICATIONS

German Search Report in corresponding German Patent Application No. DE 10 2013 205 817.9 with translation, dated Dec. 4, 2013, 10 pages.
Chinese Office Action for related Chinese Application No. 201410132482.6 dated Sep. 5, 2017.

\* cited by examiner

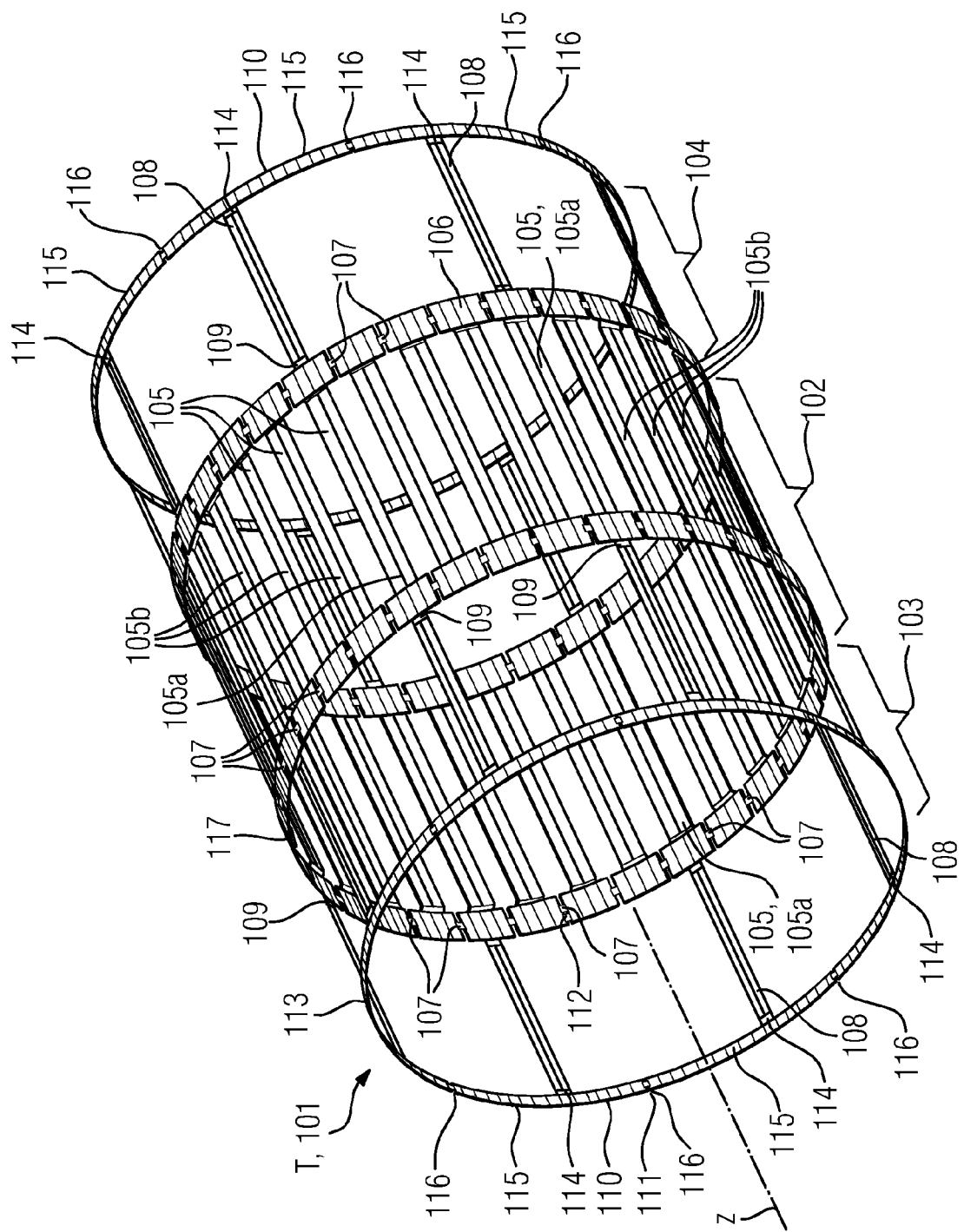

TRANSMISSION ARRANGEMENT FOR A TOMOGRAPH

This application claims the benefit of DE 102013205817.9, filed on Apr. 3, 2013, which is hereby incorporated by reference in its entirety.

BACKGROUND

The disclosed embodiments relate to a transmission arrangement for a tomograph. The disclosed embodiments may be used in magnetic resonance tomography, such as for the wireless energy supply of local coil systems.

In a tomograph examination, a patient is positioned on a couch in a cylindrical measurement area of the tomograph. A strong magnetic field is applied in the measurement area. The magnetic field has a gradient as a result of the excitation of a plurality of gradient coils. The nuclear spin of atoms is aligned by the magnetic field. Disposed within the tomograph is a transmission antenna arrangement, such as a whole body transmission antenna arrangement, e.g., a birdcage antenna, for emitting magnetic resonance radio-frequency pulses to excite the atoms. The birdcage antenna is operated with a magnetic resonance (MR) excitation frequency.

To receive the MR signals from the atoms during an MR examination, local coils are used to receive the pulses upon the relaxation of the nuclear spins. Different materials exhibit different relaxation behavior. Therefore, a conclusion about the interior of the patient's body may be drawn based on the relaxation behavior. The local coils are often combined in assemblies (called "local coil systems" hereinafter) and in each case have reception antenna elements, e.g., in the form of conductor loops. The received MR signals are also preamplified in the local coil and conducted out of the central region of the MR installation via cables. The MR signals are fed to a shielded receiver of an MR signal processing device, in which the received signals are then digitized and processed further. In many examinations, a multiplicity of local coils are arranged on the patient to cover entire regions of the patient's body.

The operation of MR systems is described e.g. in "Imaging Systems for Medical Diagnostics", Arnulf Oppelt, Publicis Corporate Publishing, ISBN 3-89578-226-2, 2006.

Energy is provided for preprocessing, such as preamplification and, if appropriate, digitization and coding, of the MR signals in the local coil system. The energy may be supplied via a cable, but a cable is undesirable because the cable cannot easily be guided (e.g., led) from the patient couch to the evaluation device. The cable is also regarded as an annoyance by operational personnel and by the patient. Further, the cable is fed loosely because the patient couch is moved together with the patient and the local coil mat.

The energy may also be supplied wirelessly via radio with a linearly polarized energy transmission antenna in the couch and an energy reception antenna coupled to the electronic circuit. However, this approach involves a couch with a complex configuration. Furthermore, the energy transmission antenna supplies maximum power in only one position of the energy reception antenna.

Energy is also supplied via radio with an energy transmission antenna as an additional insert for the MR tomograph and a matching energy reception antenna coupled to the electronic circuit. However, this arrangement is disadvantageous because, for example, the arrangement decreases the internal radius of the MR tomograph.

DE 10 2011 076 918 A1 discloses a local coil system, a transmission device, a magnetic resonance system and a method for wireless energy transfer to a local coil system. The local coil system is provided for an MR system for detecting MR signals with an energy reception antenna that inductively receives energy for the local coil system from a magnetic field that changes over time. The energy reception antenna is tunable or tuned to an energy transfer frequency lower than an MR excitation frequency or Larmor frequency of the MR signals to be detected, and higher than approximately 20 kHz. The transmission device is provided for an MR system and is configured to transmit energy to a local coil system via an energy transmission antenna that emits a magnetic field that changes over time and that has a predetermined energy transfer frequency. An oscillator device is coupled to the energy transmission antenna and generates a signal for driving the energy transmission antenna. The signal has an energy transfer frequency lower than a Larmor frequency of MR signals to be detected via the local coil system, and higher than approximately 20 kHz. The energy transmission antenna may be formed integrally with the whole body coil or around the whole body coil. The transmission device either is relatively voluminous or involves a complex excitation circuit.

SUMMARY AND DESCRIPTION

The scope of the present invention is defined solely by the appended claims and is not affected to any degree by the statements within this summary.

The present embodiments may obviate one or more of the drawbacks or limitations in the related art. For example, the disclosed embodiments may wirelessly provide energy into a measurement area of a tomograph for operation of a local coil system without reducing the internal radius of the tomograph. Wireless transfer of energy into a measurement area of the tomograph may be achieved in a compact manner, in which case generation of the energy transfer signals and generation of the MR excitation signals do not mutually influence one another, or mutually influence one another only slightly.

A transmission arrangement for a tomograph includes at least one first region having at least one first antenna element and at least one second region having at least one second antenna element. The at least one first region and the at least one second region are connected to one another via at least one rejector circuit.

The at least one first region and the at least one second region may be mechanically linked and, as a result, the transmission arrangement may be constructed compactly. The at least one rejector circuit prevents at least one operating frequency of an excited region from exciting another region not provided for that purpose (e.g., excitation). Any influence on the generation of the energy transfer signal and of the MR excitation signal is suppressed.

In one embodiment, the tomograph is an MR tomograph or a nuclear spin tomograph. However, the disclosed embodiments are not restricted to an MR tomograph or a nuclear spin tomograph. For example, the tomograph may be a positron emission tomograph.

In another embodiment, the antenna elements are elongate or rod-shaped longitudinal antenna elements. The latter are well suited to providing a homogeneous magnetic field in a cylindrical measurement area.

In one embodiment, the rejector circuit is configured as a parallel resonant circuit.

In one embodiment, the rejector circuit is provided for bridging a detuning circuit (e.g., a respective detuning circuit) on the first region. The detuning circuit may serve as an MR antenna. For this purpose, the rejector circuit may be configured as a parallel resonant circuit for the first region and as a series circuit for the second region.

The rejector circuit for bridging the detuning circuit may be configured as a parallel circuit including an inductance and a capacitance. A capacitance is connected in series with the parallel circuit. The capacitance may be at least one capacitor, and the inductance may be a coil, e.g., an inductor.

The detuning circuit may correspond to the tuning device.

In another configuration, the first region is provided for operation at a first operating frequency, the second region is provided for operation at a second operating frequency, and the rejector circuit is a rejector circuit for the first operating frequency. This configuration may prevent the second region from being excited or disturbed by the first operating frequency.

The first operating frequency may be, for example, an excitation frequency for exciting a nuclear spin (referred to hereinafter as an "MR excitation frequency" without restriction to other operating frequencies). The MR excitation frequency may be, e.g., higher than 50 MHz. The at least one first region may then also be regarded as an MR excitation antenna.

The rejector circuit for separating the regions may be configured as a parallel circuit including an inductance and a capacitance. The capacitance may be at least one capacitor, and the inductance may be a coil, e.g., an inductor.

The second operating frequency may be an energy input frequency, e.g., to supply a local coil system with energy. The energy input frequency may be, for example, between 1 MHz and 10 MHz, such as between 4 and 6 MHz. The at least one second region may then constitute at least one part of an energy input frequency antenna.

In one embodiment, the at least one first region and the at least one second region are connected to one another via at least one rejector circuit only for the first operating frequency. As a result, a rejector circuit for the second operating frequency may be obviated. The transition between a first region and a second region is then transmissive to the second operating frequency. This may be useful, if, for example, the excitability of the second region by the first operating frequency is low, e.g., effectively negligible. Also, at least part of the first region together may be utilized with the at least one second region as an antenna for the second operating frequency, e.g., as an energy input frequency antenna.

In another embodiment, the detuning circuit(s) of the first region is or are bridged via a rejector circuit (e.g., a respective rejector circuit). The rejector circuit blocks the first operating frequency and is transmissive to the second operating frequency.

In another configuration, the first region has a plurality of first antenna elements connected to one another via tuning devices. The tuning devices have high impedance for the second operating frequency. A second region is adjacent to the first region in each case on both sides such that second antenna elements of the two second regions are connected to one another via a first antenna element of the first region. The rejector circuit is transmissive for the second operating frequency. The tuning devices are used for tuning the first region. This configuration is useful in that the two second regions for the second operating frequency are linked via the first antenna elements connected thereto and these elements may form a single antenna. This one antenna is excited by the second operating frequency. This enables an excitation of the antenna and, thus, of both second regions, even when the second operating frequency is supplied to only one of the second regions. Moreover, as a result of the inclusion of selected first antenna elements in this antenna, a homogeneous circular field may be generated. The field may be generated between the two second regions arranged on both sides. The tuning devices having high impedance for the second operating frequency prevent, however, other first antenna elements from also being excited via the first excitation frequency. In this way, any influencing of the first antenna elements by the first excitation frequency may be kept low. Independent rejector circuits for the second operating frequency may likewise be dispensed with in this case.

In one embodiment, the first operating frequency is always greater than the second operating frequency. In that case, the tuning devices may also operate as high-pass filters.

A tuning device may have, for example, a trimming or tuning capacitor or a varactor diode or a variable capacitance diode.

In an alternative embodiment, the tuning devices between the first antenna elements do not have high impedance for the second operating frequency, but rather low impedance. In that case, to prevent excitation of all of the first antenna elements by the second operating frequency, at least one rejector circuit for the second operating frequency is present at least between those first antenna elements connected to a second antenna element and the first antenna elements adjacent thereto.

In yet another configuration, the at least one first region is configured as a first body coil arrangement having first antenna elements arranged parallel. Neighboring first antenna elements are connected to one another in each case by at least two tuning devices, and the at least one second region is designed as two second body coil arrangements having second antenna elements arranged in parallel. Neighboring second antenna elements of a second region are connected to one another by a connecting element, on the one hand, and are connected to one another via at least two first antenna elements of the first region, on the other hand. The second region thus provides a greater field of view (FOV) for the second excitation frequency than the first region does for the first operating frequency. For example, in cases in which the first operating frequency is an MR excitation frequency and the second operating frequency is an energy input frequency, a narrow FOV of the MR excitation field may thus be achieved. The narrow FOV may keep a gradient ambiguity and the specific absorption rate (SAR) low. Sufficient input of energy of local coils positioned at the edge of the FOV of the MR excitation field may be provided (e.g., ensured) as a result of the greater FOV of the antenna utilized for energy excitation and that functionally includes, for example, the two second regions and the first antenna elements connecting the latter.

A body coil arrangement may be an arrangement in which the antenna elements are arranged in a ring-shaped manner. If the antenna elements are longitudinal antenna elements, the latter may be arranged in a cylindrical manner, such as parallel to and at an identical distance from a central longitudinal axis. The antenna elements may also be regarded as lying parallel to one another and on a lateral surface of a cylinder, such as with adjacent antenna elements being equidistant.

In another embodiment, the first and second regions may have a cylindrical basic shape having an identical diameter. The entire transmission arrangement may then likewise have a cylindrical basic shape.

In one configuration, the transmission arrangement has a cylindrical basic shape, in which the two second regions are adjacent to the first region at end faces. As a result, a doubly resonant transmission antenna having fields of view of different magnitudes may be provided.

In one embodiment, the connecting element is designed at least partly to conduct at least the second operating frequency. The connecting element may be, e.g., a rod of the body coil antenna.

In a configuration that suppresses the first operating frequency in a second region to a greater extent, the connecting element is connected to the second antenna elements via rejector circuits for the first operating frequency.

In a configuration that suppresses the first operating frequency in a second region to a greater extent, the connecting element between neighboring second antenna elements has a rejector circuit for the first operating frequency.

In one configuration, the transmission arrangement has a plurality of input points at least including a first input point at the second region, a second input point at the first region, a third input point at the second region, and a fourth input point at the first region. The input points of the respective region are offset by 90° with respect to one another, e.g., the first input point and the second input point, and the third input point and the fourth input point.

An offset arrangement may be an arrangement angularly offset by a longitudinal extent in a circumferential direction.

In one configuration, the first input point and the third input point are disposed between at least one (e.g., two) second antenna elements of the second region.

In one embodiment, the second and fourth input points are disposed between at least one (e.g., two) first antenna elements (e.g., longitudinal antenna elements) of the second region.

In one embodiment, the second and fourth input points are disposed opposite the first input point and third input point, respectively, and are not angularly offset with respect to one another.

In one embodiment, the second and fourth input points are not disposed opposite the first and third input points, respectively, and are angularly offset with respect to one another.

In another configuration, the number of second antenna elements of a second region that are arranged in parallel is less than the number of first antenna elements of a first region that are arranged in parallel. However, the number of antenna elements may also be identical. Furthermore, the number of second antenna elements of a second region that are arranged in parallel is greater than the number of first antenna elements of a first region that are arranged in parallel.

In accordance with another aspect, a tomograph, such as an MR tomograph, includes at least one such transmission arrangement.

BRIEF DESCRIPTION OF THE DRAWINGS

FIG. 1 shows a transmission arrangement for an MR tomograph in accordance with one embodiment.

DETAILED DESCRIPTION

FIG. 1 shows a transmission arrangement 101 for a magnetic resonance tomograph T. The transmission arrangement may also be configured as a transmission antenna. The transmission arrangement 101 includes three regions, namely, a central first region 102 having a cylindrical basic shape and, adjacent thereto at the end sides, a second region 103 and a second region 104. The two second regions 103, 104 are likewise of cylindrical basic shape and of the same diameter as the first region 102. As a result, the transmission antenna 101 as a whole also has a cylindrical shape. The longitudinal axis of the cylindrical shape corresponds to the z-axis z. The two second regions 103, 104 have a construction that is mirror-symmetrical with respect to the longitudinal axis z.

The first region 102 has thirty-two linear or rod-shaped antenna elements, which are designated hereinafter as first longitudinal antenna elements 105. The first longitudinal antenna elements 105 are aligned in parallel to one another and in parallel to the longitudinal axis z. The first longitudinal antenna elements 105 may be angularly offset equidistantly in the circumferential direction about the longitudinal axis z and are therefore at the same distance from the longitudinal axis z. This arrangement of the first longitudinal antenna elements may also be designated as a "body coil arrangement" or a "birdcage arrangement".

The first longitudinal antenna elements 105 have connection regions 106 widened at both ends. Adjacent first longitudinal antenna elements 105 are connected to one another at the connection regions 106 thereof via tuning devices, e.g., in the form of a tuning capacitor 107.

The two second regions 103 and 104 have eight linear or rod-shaped antenna elements, which are designated hereinafter as second longitudinal antenna elements 108. The second longitudinal antenna elements 108 are also aligned in parallel to one another and in parallel to the longitudinal axis z. The second longitudinal antenna elements 108 are likewise angularly offset equidistantly in the circumferential direction about the longitudinal axis z and are therefore at the same distance from the longitudinal axis z. The regions 102, 103 and 104 have the same diameter such that the first longitudinal antenna elements 105 and the second longitudinal antenna elements 108 are at the same distance from the longitudinal axis z. This arrangement of the second longitudinal antenna elements likewise corresponds to a "body coil arrangement" or a "birdcage arrangement".

Second longitudinal antenna elements 108 of the second regions 103 and 104 are disposed opposite relative to one another along the longitudinal axis z. The second longitudinal antenna elements 108 therefore lie along an identical axis parallel to the longitudinal axis z. The second longitudinal antenna elements 108 are connected to one another by a first longitudinal antenna element 105, 105a in each case. This connection is not established directly, but rather via respective rejector circuits 109 between the second longitudinal antenna elements 108 and the first longitudinal antenna element 105, 105a connected thereto.

At the end of the longitudinal antenna elements 108 opposite to the first longitudinal antenna element 105, 105a, the second longitudinal antenna elements 108 of the second regions 103, 104 are connected to one another via a respective end ring 110.

The tuning capacitors 107 are configured such that the capacitors 107 have high impedance for a second operating frequency of the second regions 103 and 104 (referred to hereinafter as an "energy input frequency"). The tuning capacitors 107 thereby prevent the energy input frequency from being fed or input into the first longitudinal antenna elements 105, 105b not connected to the second longitudinal antenna elements 108, or prevent such input at least to a practically small or negligible extent.

The rejector circuits 109, by contrast, block a first operating frequency of the first region 102 (referred to hereinafter as an "MR excitation frequency"), such that the MR excitation frequency is not fed or input into the second longitudinal antenna elements 108, or is fed in only to a practically negligible extent. The rejector circuits 109 may be configured as parallel resonance circuits. The rejector circuits 109 may be provided for bridging a detuning circuit (not illustrated), e.g., a respective detuning circuit, at the first region 102.

Overall, this results in a doubly resonant transmission arrangement 101 in a body coil arrangement. The first region 102 may be operated with the MR frequency, e.g., in order to excite bodies disposed in the first region 102 to undergo nuclear spin resonance. By contrast, the second regions 103 and 104 are not influenced, or not significantly influenced, by the MR excitation operation of the first region 102.

The second regions 103 and 104 connected to one another via the first longitudinal antenna elements 105a are used, by contrast, for wirelessly feeding energy into local coils or local coil systems (as described, e.g., in DE 10 2011 076 918 A1). The second regions 103 and 104 together with the first longitudinal antenna elements 105a may therefore form an energy input antenna 103, 104, 105a in body coil or birdcage form, which may be operated at the energy input frequency. The energy input frequency is lower than the MR excitation frequency and, in this example, is between 1 MHz and 10 MHz. By contrast, the MR frequency in this example is higher than 50 MHz.

The end rings 110 of the second regions 103 and 104 may be connected to the associated second antenna elements 108 via additional rejector circuits 114 for the MR excitation frequency to further reduce the interference effect of the MR excitation frequency on the energy input antenna 103, 104, 105a.

The end rings 110 in this example have a plurality of ring-sector-shaped portions 115. The portions 115 are connected to one another by rejector circuits 116 for the MR excitation frequency in such a way that adjacent second antenna elements 108 are connected to one another via a respective rejector circuit 116. The end ring 110 has a rejector circuit 116 for the MR excitation frequency between adjacent second antenna elements 108.

The energy input antenna 103, 104, 105a is useful in that the energy input frequency need be fed in or input at only one of the second regions 103 or 104. This is indicated in this example by a first input point 111 and a third input point 113 at the end ring 110 of the first region 103. The third input point 113 is disposed in a manner angularly offset by 90° about the longitudinal axis z with respect to the first input point 111. As a result, the first input point 111 and the third input point 113 are separated from one another by two ring-sector-shaped portions 115 of the common end ring 110. The energy input antenna 103, 104, 105a may be operated by the energy input frequency being applied to the first input point 111 and the third input point 113.

A second input point 112 and a fourth input point 114 are disposed between two respective first longitudinal antenna elements 105b of the first region 102. The second input point 112 and the fourth input point 114 are disposed opposite the first input point 111 and the third input point 113, respectively, relative to the longitudinal axis z. The second input point 112 and the fourth input point 114 are therefore likewise angularly offset by 90° about the longitudinal axis z. The first region 102, serving as MR antenna, may be operated by the MR excitation frequency being applied to the second input point 112 and the fourth input point 117.

Since the rejector circuits 109 are configured to block the MR excitation frequency, but not the energy input frequency, corresponding excitation currents also flow through the first longitudinal antenna elements 105a and through the opposite second region 104. On the other hand, however, because the tuning capacitors 107 are configured to have high impedance for the energy input frequency, the other longitudinal antenna elements 105b are not excited, or not significantly excited, by the energy input frequency. The first region 102 is therefore effectively decoupled from the energy input frequency without requiring dedicated rejector circuits for that purpose. Therefore, the first region 102 may effectively serve as an MR antenna for emitting excitation signals for generating nuclear spin excitations without interference by the energy input frequency.

The transmission arrangement 101 may also be useful in that the first region 102 serving as an MR antenna has a comparatively narrow FOV, which keeps signal ambiguities (e.g., relative to a gradient) and the SAR low. By contrast, the energy input antenna 103, 104, 105a has a wider FOV, through which local coils positioned at an edge of the FOV of the first region 102 may be reliably supplied with energy. Such marginally positioned local coils may also be operated by a homogeneously present energy input field.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims can, alternatively, be made to depend in the alternative from any preceding or following claim, whether independent or dependent, and that such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A transmission arrangement for a tomograph, the transmission arrangement comprising:
    a first region having at least one first antenna element, wherein the first region is configured to operate at a first operating frequency; and
    a second region having at least one second antenna element, wherein the second region is configured to operate at a second operating frequency;
    wherein the first region and the second region are connected to one another via a rejector circuit, wherein the rejector circuit is configured to reject the first operating frequency.

2. The transmission arrangement of claim 1, wherein the first operating frequency is an excitation frequency for exciting a nuclear spin.

3. The transmission arrangement of claim 1, wherein the second operating frequency is an energy input frequency to supply a local coil system with energy.

4. The transmission arrangement of claim 1, wherein:
    the first region has a plurality of first antenna elements connected to one another via tuning devices;

the tuning devices have an impedance for the second operating frequency;
a pair of second regions is adjacent to the first region on each side of the first region such that second antenna elements of each second region are connected to the second antenna elements of the other second region via a first antenna element of the first region; and
the rejector circuit is transmissive at the second operating frequency.

5. The transmission arrangement of claim 4, wherein:
the first region is designed as a first body coil arrangement having first antenna elements arranged in parallel, with neighboring first antenna elements being connected to one another by at least two tuning devices;
the second region comprises two second body coil arrangements, each second body coil arrangement having second antenna elements arranged in parallel;
neighboring second antenna elements of the second region are connected to one another by a connecting element; and
neighboring second antenna elements of the second region are connected to one another via at least two of the first antenna elements of the first region.

6. The transmission arrangement of claim 5, wherein:
the transmission arrangement has a cylindrical basic shape; and
the two second regions are adjacent to the first region at end faces.

7. The transmission arrangement of claim 5, wherein the connecting element is connected to the second antenna elements via rejector circuits for the first operating frequency.

8. The transmission arrangement of claim 5, wherein the connecting element between neighboring second antenna elements has a rejector circuit for the first operating frequency.

9. The transmission arrangement of claim 1, further comprising a plurality of input points, the plurality of input points comprising:
a first input point at the second region;
a second input point at the first region;
a third input point at the second region; and
a fourth input point at the first region
wherein the first and third input points are offset by 90° with respect to one another.

10. The transmission arrangement of claim 9, wherein:
the first input point and the second input point are opposite one another; and
the third input point and the fourth input point are opposite one another.

11. The transmission arrangement of claim 1, wherein the rejector circuit is configured as a parallel resonant circuit.

12. The transmission arrangement of claim 11, wherein the rejector circuit is provided for bridging a detuning circuit on the first region.

13. The transmission arrangement of claim 2, wherein:
the first region has a plurality of first antenna elements connected to one another via tuning devices;
the tuning devices have an impedance for the second operating frequency;
a pair of second regions is adjacent to the first region on each side of the first region such that second antenna elements of each second region are connected to the second antenna elements of the other second region via a first antenna element of the first region; and
the rejector circuit is transmissive at the second operating frequency.

14. The transmission arrangement of claim 13, wherein:
the first region is designed as a first body coil arrangement having first antenna elements arranged in parallel, with neighboring first antenna elements being connected to one another by at least two tuning devices;
the second region is designed as two second body coil arrangements, each second body coil arrangement having second antenna elements arranged in parallel;
neighboring second antenna elements of the second region are connected to one another by a connecting element; and
neighboring second antenna elements of the second region are connected to one another via at least two of the first antenna elements of the first region.

15. The transmission arrangement of claim 3, wherein:
the first region has a plurality of first antenna elements connected to one another via tuning devices;
the tuning devices have an impedance for the second operating frequency;
a pair of second regions is adjacent to the first region on each side of the first region such that second antenna elements of each second region are connected to the second antenna elements of the other second region via a first antenna element of the first region; and
the rejector circuit is transmissive at the second operating frequency.

16. The transmission arrangement of claim 15, wherein:
the first region is designed as a first body coil arrangement having first antenna elements arranged in parallel, with neighboring first antenna elements being connected to one another by at least two tuning devices;
the second region is designed as two second body coil arrangements, each second body coil arrangement having second antenna elements arranged in parallel;
neighboring second antenna elements of the second region are connected to one another by a connecting element; and
neighboring second antenna elements of the second region are connected to one another via at least two of the first antenna elements of the first region.

17. The transmission arrangement of claim 2, further comprising a plurality of input points, the plurality of input points comprising:
a first input point at the second region;
a second input point at the first region;
a third input point at the second region; and
a fourth input point at the first region
wherein the first and third input points are offset by 90° with respect to one another.

18. A transmission arrangement for a tomograph, the transmission arrangement comprising:
at least one first region having first antenna elements; and
at least one second region having second antenna elements,
wherein the at least one first region and the at least one second region are connected to one another via at least one rejector circuit, and
wherein a number of the second antenna elements of a respective second region of the at least one second region that are arranged parallel is less than a number of the first antenna elements of a respective first region of the at least one first region that are arranged parallel.

19. A transmission arrangement for a tomograph, the transmission arrangement comprising:
a rejector circuit;
a first region having a first antenna element; and a second region having a second antenna element separated from the first antenna element by the rejector circuit;

wherein the first region and the second region are connected to one another via the rejector circuit, and wherein the rejector circuit is configured to prevent an operating frequency of the first region from exciting the second region.

* * * * *